(12) United States Patent
Fan et al.

(10) Patent No.: US 6,740,212 B2
(45) Date of Patent: May 25, 2004

(54) RECTANGULAR MAGNETRON SPUTTERING CATHODE WITH HIGH TARGET UTILIZATION

(75) Inventors: Qi Hua Fan, 2915 Aspen Ridge Dr., Ann Arbor, MI (US) 48103; Li Qin Zhou, 2915 Aspen Ridge Dr., Ann Arbor, MI (US) 48103

(73) Assignees: Qi Hua Fan, Ann Arbor, MI (US); Li Qin Zhou, Ann Arbor, MI (US)

( * ) Notice: Subject to any disclaimer, the term of this patent is extended or adjusted under 35 U.S.C. 154(b) by 12 days.

(21) Appl. No.: 10/273,083

(22) Filed: Oct. 18, 2002

(65) Prior Publication Data

US 2004/0074771 A1 Apr. 22, 2004

(51) Int. Cl.[7] .............................................. C23C 14/35
(52) U.S. Cl. .......................... 204/298.12; 204/298.17; 204/298.19
(58) Field of Search .................... 204/298.12, 298.17, 204/298.19, 298.11, 298.16

(56) References Cited

U.S. PATENT DOCUMENTS 5,262,028 A * 11/1993 Manley ................. 204/192.12
5,985,115 A * 11/1999 Hartsough et al. ...... 204/298.09
6,432,285 B1 * 8/2002 Kastanis et al. ....... 204/298.16

* cited by examiner

Primary Examiner—Steven Versteeg

(57) ABSTRACT

The present invention discloses a novel rectangular sputtering magnetron cathode that significantly improves target utilization and sputtering efficiency. Different from conventional magnatron design that considers only magnetic field distribution and is, therefore, qualitive or empirical, the present magnetron cathode is developed through computer-aided simulation of plasma discharge. The magnetic and electric fields are optimized in a combined manner by quantitatively simulating electron trajectories, electron/Ar collisions, space charge distribution, and target erosion profile. Sputtering tests with Cu target show a target utilization of 55%~65%, much higher than conventional target utilization which is about 40%. Meanwhile, high sputtering efficiency is achieved by maintaining a relatively strong magnetic field over the surface of the target, which can be thicker than 12 mm, as a result of effective confinement of high-energy electrons.

10 Claims, 11 Drawing Sheets

Cross-section of the straight portion of the rectangular magnetron cathode in present invention. Parts are defined as follows.

| 1: Bottom Plate, | 2: Center Magnet, | 3: Bottom Magnet, | 4: Bottom Magnet, |
| 5: Bottom Pole, | 6: Bottom Pole, | 7: Side Magnet, | 8: Side Magnet, |
| 9: Cooling Plate, | 10: Center Pole, | 11: Side Pole, | 12: Side Pole, |
| 13: Target | | | |

FIG. 1. Cross-section of the straight portion of the rectangular magnetron cathode in present invention. Parts are defined as follows.
| | | | |
|---|---|---|---|
| 1: Bottom Plate, | 2: Center Magnet, | 3: Bottom Magnet, | 4: Bottom Magnet, |
| 5: Bottom Pole, | 6: Bottom Pole, | 7: Side Magnet, | 8: Side Magnet, |
| 9: Cooling Plate, | 10: Center Pole, | 11: Side Pole, | 12: Side Pole, |
| 13: Target | | | |
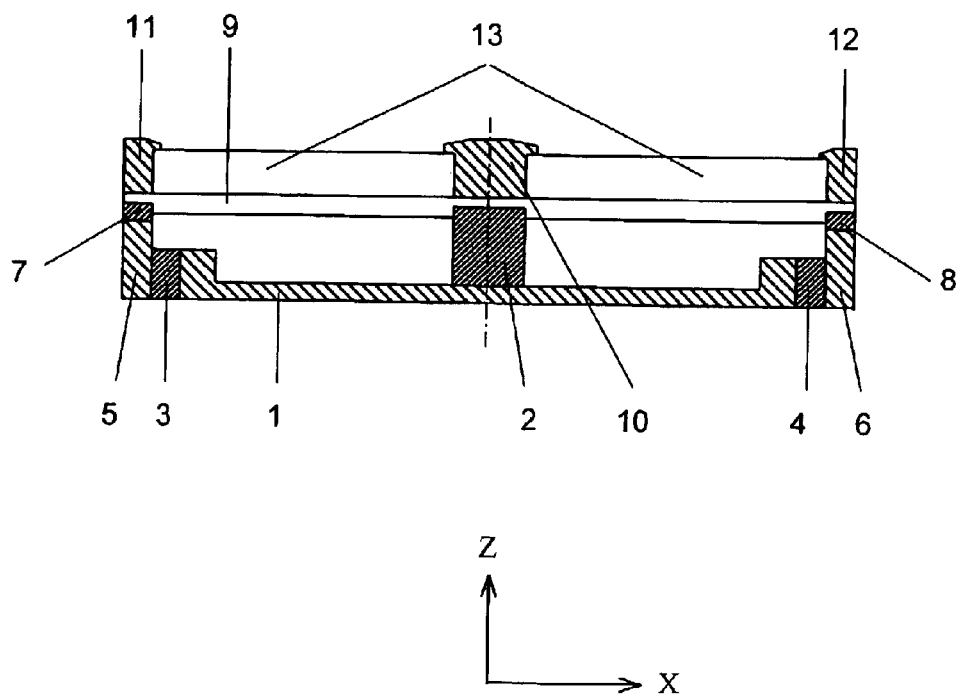

FIG. 2. Cross-section of the end portion of the rectangular magnetron cathode in present invention. Parts are defined as follows.
14: Bottom Plate,    15: Inner Magnet,    16: Out Magnet,    17: Out Concentrator
18: Cooling Plate,   19: End Shunt,       20: End Target,    21: End Pole
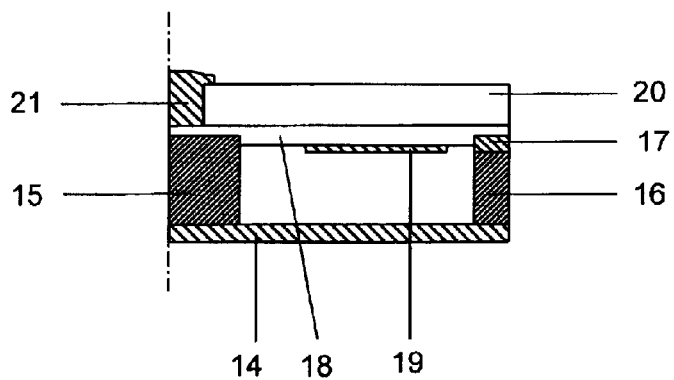
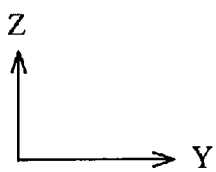

FIG. 3. A contour plot of vertical component $B_n$ of magnetic flux density in the target surface, including an end portion and part of the straight portion. $B_n$ unit: Tesla.
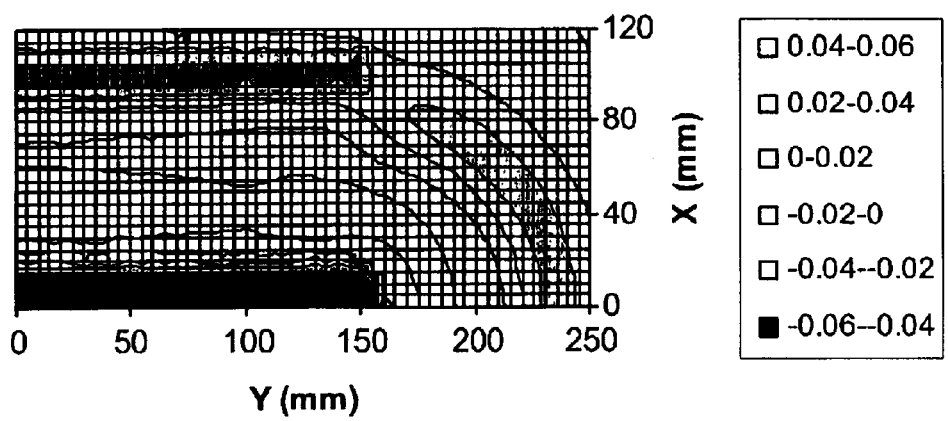

FIG. 4. A contour plot of horizontal component $B_t$ of magnetic flux density in the target surface, including an end portion and part of the straight portion. $B_t$ unit: Tesla.
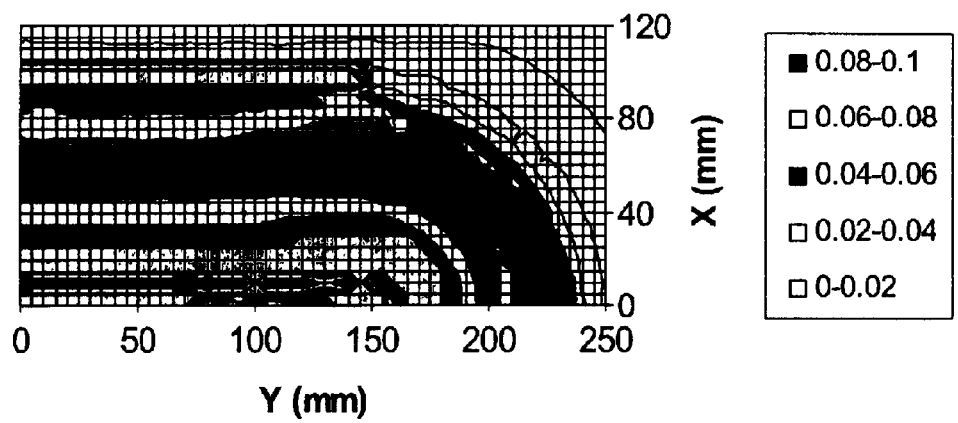

FIG. 5. Vertical flux density $B_n$ and horizontal flux density $B_t$ along one single line parallel to X-axis direction at Y=50 mm (refer coordinates in FIG. 3 and FIG. 4) in the target surface plane.
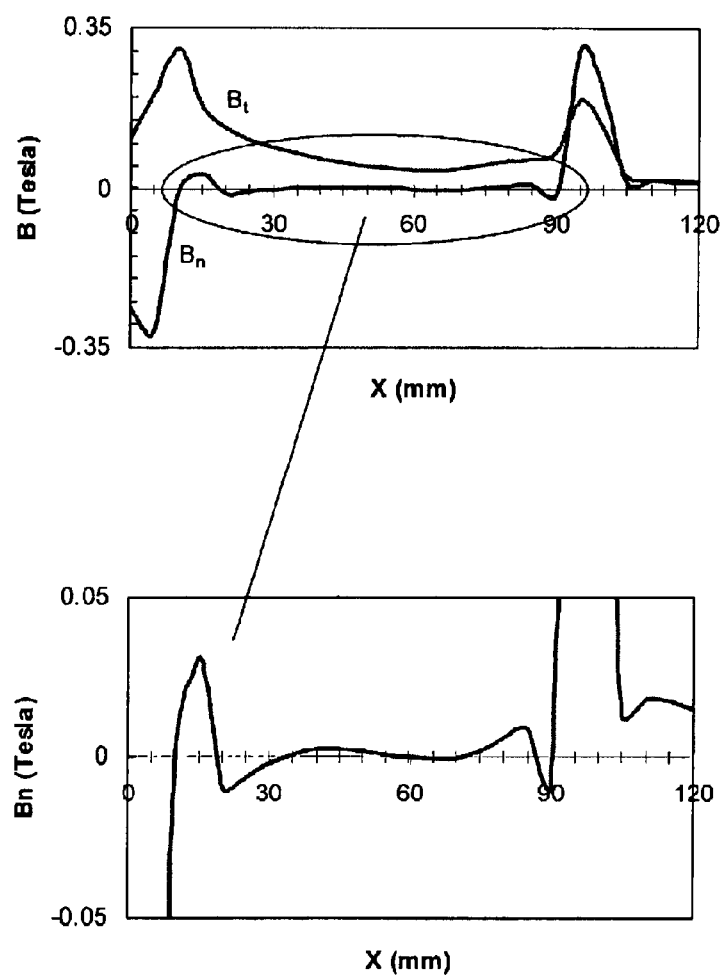

FIG. 6. An example of simulated electron trajectories in part of the straight portion. (A) Top view, (B) side view
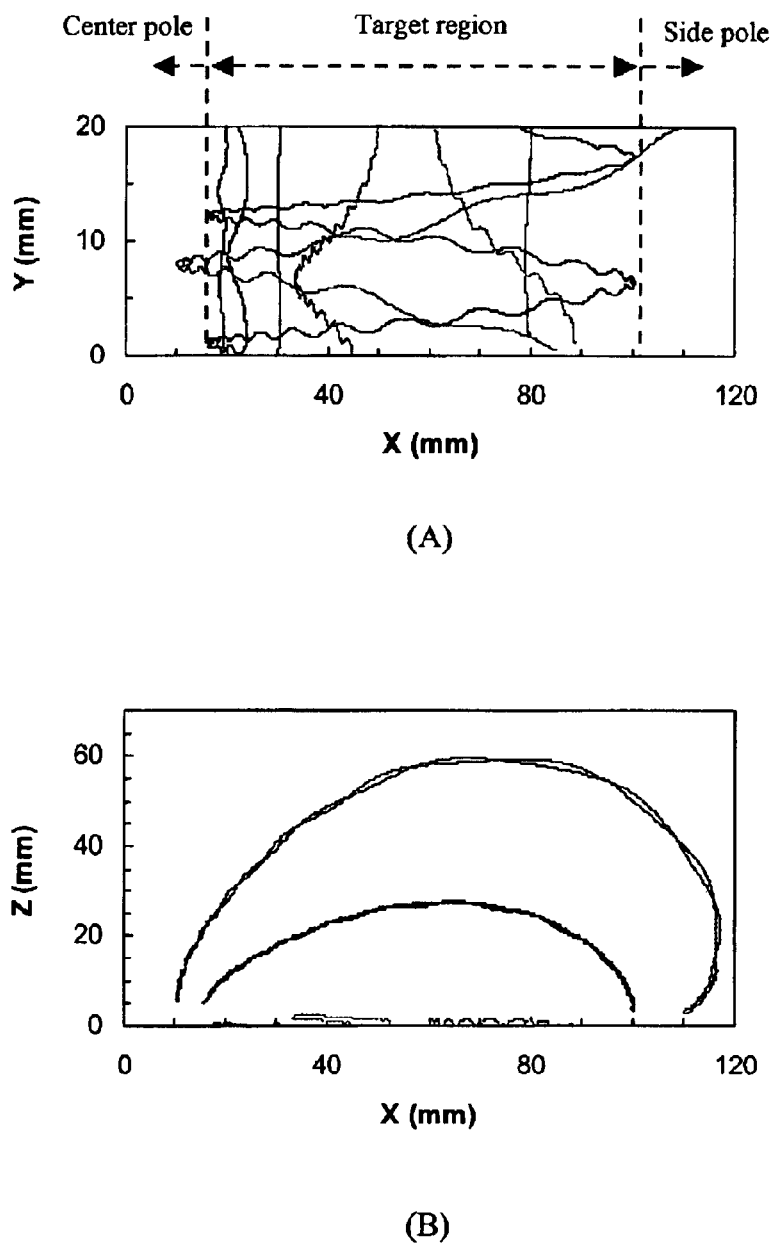
(A)
(B)

FIG. 7. An example of simulated ionization distribution over part of the target surface in the straight portion. (A) Top view, (B) side view.
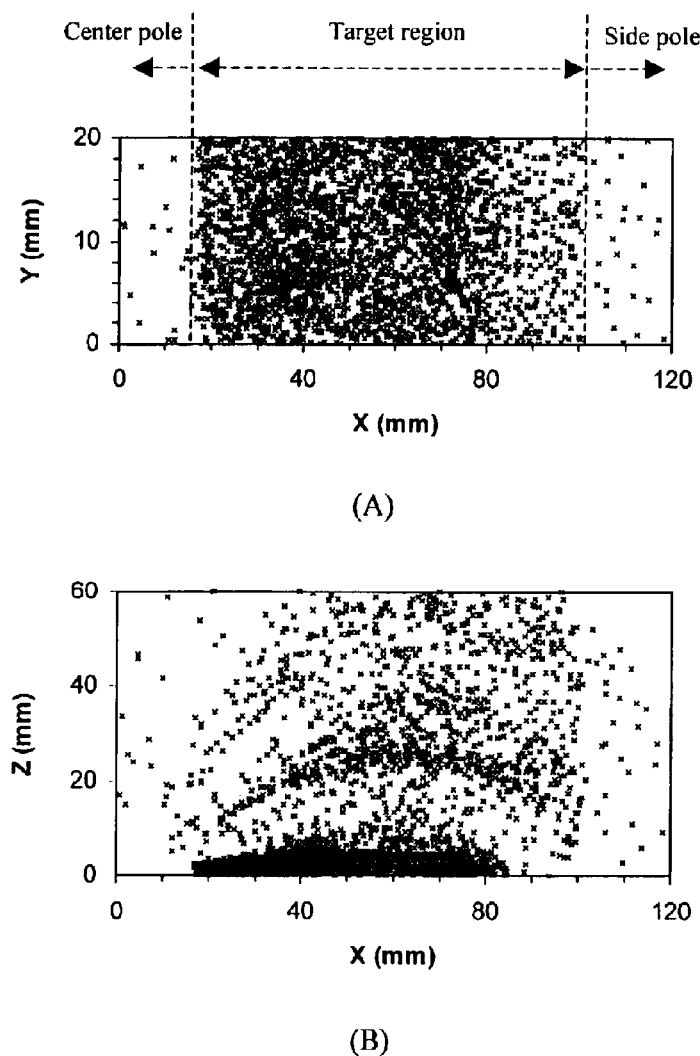

FIG. 8. Simulated target erosion profile (continuous line) and experimental target profile (□) in the straight portion of the magnetron cathode in present invention.
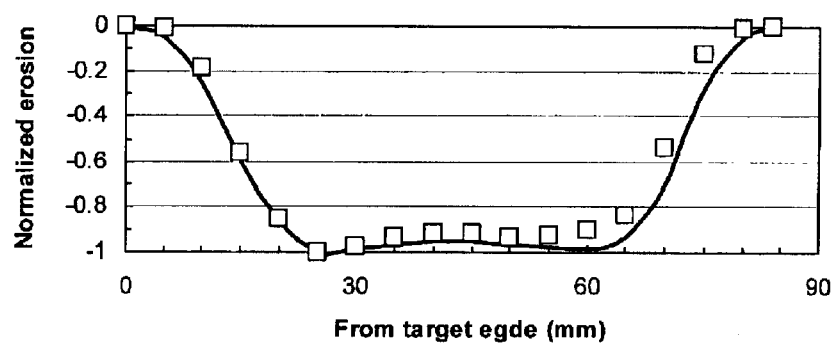

FIG. 9. I-V curves of the magnetron cathode in present invention. Sputtering gas is Ar.
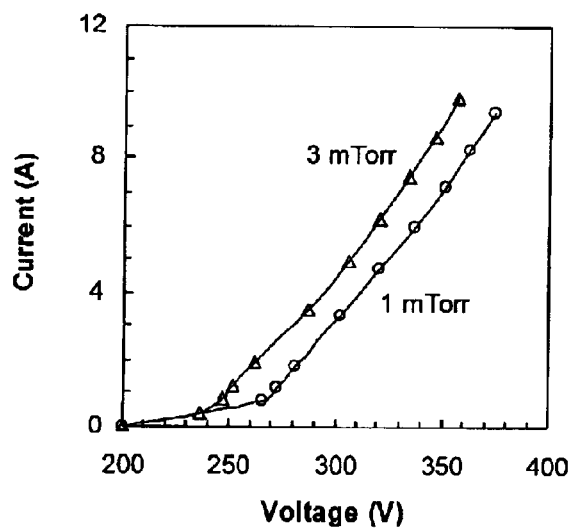

FIG. 10. Normalized thickness distribution of Cu film over the rectangular magnetron cathode with a target length of 900 mm. The glass substrate is set at 90 mm away from the target surface. Deposition conditions: gas pressure 3 mTorr, voltage 346 V, current 8.69 A.
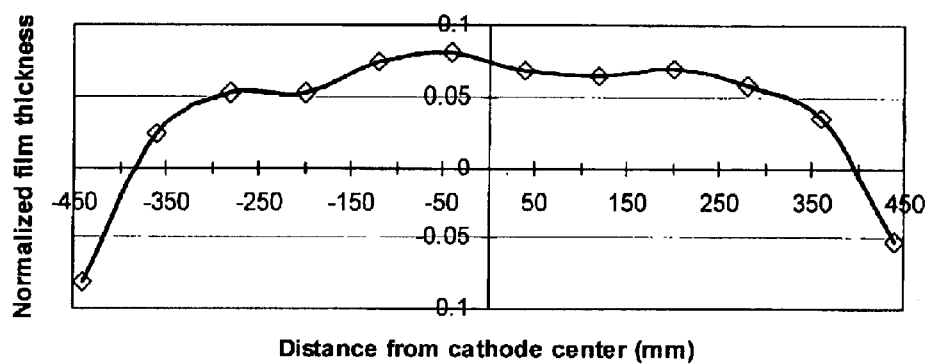

FIG. 11. X-ray fluorescence spectrum taken from a very thick Cu film deposited onto a glass substrate for two hours using the magnetron sputtering cathode in present invention.
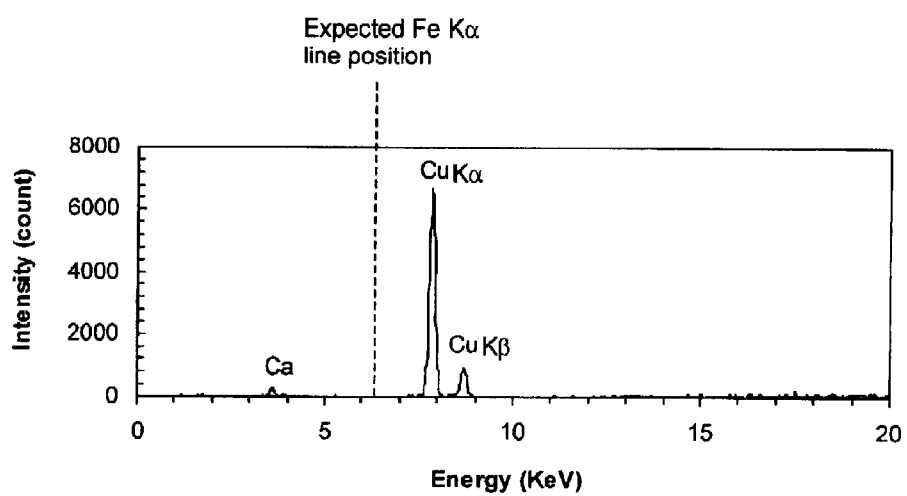

RECTANGULAR MAGNETRON SPUTTERING CATHODE WITH HIGH TARGET UTILIZATION

BACKGROUND OF THE INVENTION

The present invention relates to the field of magnetron sputtering for producing coatings on substrates and more specifically to planar magnetron sputtering with a rectangular cathode, which can be extended to a desired length, having a high utilization of target materials, high sputtering efficiency, and long target lifetime.

Magnetron sputtering is one of the most common techniques in production and laboratory for the deposition of thin films of various materials including conductors, semiconductors, and insulators. The magnetron sputtering is usually conducted using a so-called magnetron cathode in a vacuum chamber with the presence of one or more sputtering gases maintained under relatively low pressure. The magnetron cathode includes a cathode body and a target. The target is the material to be deposited onto the substrate, while the cathode body includes mainly permanent magnets or electromagnets, magnetically permeable materials, and cooling devices. The permanent magnets, with the aid of the magnetically permeable materials, generate a proper magnetic field above the target surface. During magnetron sputtering, a negative bias of a DC power (or an AC power) is applied to the target, establishing an electric field between the target and the grounded vacuum chamber and/or the grounded substrate. The movement of charged particles in the electric and magnetic fields is governed by the equations $$d(mV)/dt = q(V \times B + E) \quad (1)$$

and $$d(r)/dt = V, \quad (2)$$

where m is the mass, V the velocity, t time, q the charge, E the electric field, B the magnetic flux density, r the position. A properly designed magnetic field acting together with the electric field can confine high-energy electrons, which are very light, to the vicinity of the target surface and produce efficient ionization of the sputtering gas. The magnetic field in a normal magnetron cathode has little effect on the movement of the ions of the sputtering gas (usually Ar) due to their heavy mass. Therefore, the ions just follow the direction of the electric field and strike the target, causing sputtering of the target material that is subsequently deposited onto a substrate that faces the target. These characteristics lead to two distinctive features of magnetron sputtering, i.e., a relatively low gas pressure and low voltage to maintain glow discharge; and a high plasma density and few bombardments of high-energy electrons to substrate to deposit film at high rate with low substrate temperature.

The ionization distribution above the target surface determines the shape of erosion in the target and consequently the target utilization rate. The location of ionization caused by a collision between a high-energy electron and an atom of the sputtering gas is generally a random event. In the region where high-energy electrons appear more often there exists a higher probability of ionization. Most conventional magnetron sputtering cathodes have a closed and convexly arched shape of magnetic flux over the target surface that is usually flat. Since the magnetic and electric fields are not uniform, electrons in a magnetron discharge move in a complicated manner in a three dimensional space above the target surface. Their velocities change with time and position. However, as a result of the ($V \times B + E$) drift, electrons tend to pass the center of the arched magnetic flux, where the vertical component of the magnetic flux density is zero and the magnetic field is completely parallel to the target surface. This feature leads to a relatively dense ionization in that region and produces strong erosion of target therein in a conventional magnetron. As a result, the target is usually eroded in a narrow V-shape, giving a target utilization of only about 20% to 30%. Since most of the commonly used target materials are very expensive, such a low target utilization increases the costs of sputtering process and wastes a lot of target materials, some of which are difficult to recycle. Therefore, a significant increase in the target utilization is always highly desired.

Over the years, numerous efforts have been made to improve target utilization in a sputtering magnetron. McLeod, in U.S. Pat. No. 3,956,093, increases the erosion area of target by using an electromagnet coil to generate a variable magnetic field above the target surface so that the center of the erosion groove shifts in an oscillatory manner [1]. A later U.S. Pat. No. 4,444,643 of Garrett similarly improves the utilization by mechanically moving the entire magnet assembly behind the target [2]. These improvements have been obtained with the expense of additional electrical and/or mechanical complexity. Class in U.S. Pat. No. 4,198,283 proposes using a target with special cross sectional shape that follows the magnetic flux line above the target surface [3]. This improves the target utilization at the cost of target machining. Actually, many ceramics targets are expensive to machine, while most standard target materials have a flat surface. Therefore, sputtering systems using a flat target with static and simple magnet assembly are still preferred in production and laboratory. Due to these facts, Morrison and Charles in U.S. Pat. Nos. 4,162,954 and 4,180,450 disclose planar magnetrons with flattened magnetic flux generated by static sources and improve target utilization [4, 5]. Welty in U.S. Pat. No. 4,892,633 further improves the utilization to ~50% by setting a magnetically permeable shunt between center magnet and outer magnet and consequently changing the shape of the magnetic flux over the target surface [6]. However, the magnetic shunt meanwhile weakens the strength of the magnetic field and, therefore, limits the maximum allowable target thickness and sputtering rate. Later, Manley, in U.S. Pat. No. 5,262,028, proposes an alternative magnet assembly and achieves also high target utilization ~50% [7]. In Manley'ss magnetron, relatively small magnets are used and set on a magnetically permeable plate to generate an idea shape of magnetic flux over the target surface, especially in the straight section of a rectangular cathode. Therefore, the plate actually shunts the magnetic field. This again limits the sputtering efficiency for relatively thick target, as some high-energy electrons cannot be confined effectively due to scattering by collision with sputtering gas atoms. In addition, to sputter some ceramic targets or to conduct reactive sputtering, a relatively strong magnetic field over the target surface is desired to avoid charge accumulation and consequent arcs in target surface.

As a summary, it is still highly desired to develop new sputtering magnetrons with relatively simple or static magnet assembly to achieve higher utilization of target. Also, the magnetron cathode should be able to produce a relatively strong magnetic field over the surface of a thick target, i.e. ~12 mm, to realize high sputtering efficiency and long target lifetime.

As mentioned before, the movement of a charged particle in a sputtering magnetron is governed by both the magnetic field and the electric field. Therefore, three-dimensional distribution of the magnetic and the electric fields over the target surface should be taken into account in the magnetron design. Unfortunately, all previous efforts only concentrated on the design of magnetic field. The role of electric field that is actually determined by the distribution of space charges that are highly non-equilibrium in the dark space above the target surface has yet been considered. Thus the magnetron design is only qualitative or empirical since no efforts have been made to optimize the magnetic and electric fields in a combined manner to maximize the target erosion through quantitative consideration of electron trajectories, electron/Ar collisions, ionization and space charge distributions. It should be noted that several authors have reported numerical simulation of sputtering magnetron [8–11]. The work has been mainly focusing on theoretical understanding the plasma discharge with no emphasis on using the computer-aided design to optimize the performance of a sputtering magnetron.

In this invention, we present a novel rectangular sputtering magnetron designed by considering not only the magnetic field but also electron drift trajectory, electron/Ar collision, ionization distribution, and electric field distribution. Numerical calculation and Monte Carlo simulation are employed to predict the target erosion. Consequently the magnet assembly, electrode shape and/or electric field are optimized to achieve a substantial improvement of target utilization. A relatively strong magnetic field is maintained over the target surface to ensure efficient sputtering.

BRIEF SUMMARY OF THE INVENTION

A novel rectangular magnetron sputtering cathode is developed through computer-aided simulation of plasma discharge to provide a high utilization of target materials. The cathode includes a cooling plate that separates the cathode into two parts—an upper part and a lower part. The upper part includes a center pole, two side poles, two end poles, and target. The poles are made from magnetically permeable materials with a cap higher than the target surface to provide a component of electric field parallel to the target plane. The lower part includes a magnetically permeable bottom plate, on which are a center magnet, two bottom magnets, two side magnets, two bottom poles, two sets of end magnets and end poles, and end shunts. All magnets are of permanent magnet. The poles and shunts are made from magnetically permeable materials. The magnetron is designed according to the principle that the movement of charged particles in a sputtering magnetron is governed by both magnetic field and electric field. The magnet assembly in present invention is optimized in combination with electrode configuration through quantitative simulation of electron trajectories, electron/Ar collisions, space charge distribution, and target erosion profile. This provides a much higher accuracy as compared with conventional magnetron development, which only considers magnetic field distribution in a qualitative manner. Sputtering tests with Cu target show a target utilization of 55%~65%, much higher than the target utilization, ~40%, in a conventional magnetron sputtering. Along with high utilization, high sputtering efficiency is achieved due to the presence of a relatively strong magnetic field over the target surface and consequently an effective confinement of high-energy electrons during the magnetron discharge. X-ray fluorescence analysis shows that pure film can be deposited with this novel magnetron cathode.

BRIEF DESCRIPTION OF THE SEVERAL VIEWS OF THE DRAWING

FIG. 1. Cross-section of the straight portion of the rectangular magnetron cathode in present invention. Parts are defined as follows.

1: Bottom Plate,
2: Center Magnet,
3: Bottom Magnet,
4: Bottom Magnet,
5: Bottom Pole,
6: Bottom Pole,
7: Side Magnet,
8: Side Magnet,
9: Cooling Plate,
10: Center Pole,
11: Side Pole,
12: Side Pole,
13: Target FIG. 2. Cross-section of the end portion of the rectangular magnetron cathode in present invention. Parts are defined as follows.

14: Bottom Plate,
15: Inner Magnet,
16: Out Magnet,
17: Out Concentrator,
18: Cooling Plate,
19: End Shunt,
20: End Target,
21: End Pole FIG. 3. A contour plot of vertical component $B_n$ of magnetic flux density in the target surface, including an end portion and part of the straight portion. $B_n$, unit: Tesla.

FIG. 4. A contour plot of horizontal component $B_t$ of magnetic flux density in the target surface, including an end portion and part of the straight portion. $B_t$, unit: Tesla.

FIG. 5. Vertical flux density $B_n$ and horizontal flux density $B_t$ along one single line parallel to X-axis direction at Y=50 mm (refer coordinates in FIG. 3 and FIG. 4) in the target surface plane.

FIG. 6. An example of simulated electron trajectories in part of the straight portion. (A) Top view, (B) side view.

FIG. 7. An example of simulated ionization distribution over part of the target surface in the straight portion. (A) Top view, (B) side view.

FIG. 8. simulated target erosion profile (continuous line) and experimental target profile (□)in the straight portion of the magnetron cathode in present invention.

FIG. 9. I-V curves of the magnetron cathode in present invention. Sputtering gas is Ar.

FIG. 10. normalized thickness distribution of Cu film over the rectangular magnetron cathode with a target length of 900 mm. The glass substrate is set at 90 mm away from the target surface. Deposition conditions: gas pressure 3 mTorr, voltage 346 V, current 8.69 A.

FIG. 11. X-ray fluorescence spectrum taken from a very thick Cu film deposited onto a glass substrate for two hours using the magnetron cathode in present invention.

DETAILED DESCRIPTION OF THE INVENTION

To realize a normal sputtering operation of a magnetron cathode, several fundamental components are also needed besides the cathode body and target. These components may include but not limit to:
1. A vacuum chamber, in which the sputtering is conducted, with a proper pumping system;
2. Insulator to separate electrically the target cathode from the grounded chamber;
3. A sealing plate on which the cathode body is attached and in which there is usually an O-ring to ensure a suitable low pressure in the vacuum chamber;
4. A target cooling loop and connections;
5. A power source for maintaining plasma discharge and electrical connections from the power source to the target cathode;
6. A grounded shield to prevent arcs and unwanted sputtering of cathode materials other than the target;
7. Gas flow and/or gas pressure controllers.

These components are well known to persons with ordinary skill in the art and, therefore, they are not shown and described in the present invention.

Drawings illustrated herein are of planar magnetron sputtering cathode with a flat target surface in rectangular shape. However, the cathode can be equally applied to non-planar and/or non-rectangular target. Also, the target small pieces—the later case is especially applicable to ceramic target materials that are difficult to produce in large area and/or are easy to crack during sputtering. The cathode can be expanded to any desired length by extending the straight portion, while the end portions are kept the same. Sputtering operation may be conducted in one or more gases.

The magnetron cathode in present invention consists of a straight portion and two identical end portions to form a closed loop for magnetic field above the target surface. The cathode configuration and its characteristics are described in details below.

Cathode Structure in Straight Portion

FIG. 1 shows the cross section of the straight portion of the rectangular magnetron cathode in present invention. Reference coordinates are also shown in FIG. 1. The Bottom Plate 1 is made from magnetically permeable materials. It has a wide U-shape, formed by either a complete part or several parts.

A Center Magnet 2 is set on and at the center of the Bottom Plate 1. The Center Magnet 2 is magnetized in a direction perpendicular to the surface of the Bottom Plate 1. The Center Magnet generally comprises many pieces set direction of the cathode.

There are two Bottom Magnets 3 and 4 set on each side of the Bottom Plate 1, respectively. These magnets generally comprise many pieces set the long direction of the cathode, respectively. The Bottom Magnet 3 is magnetized in a direction parallel to the surface of the bottom plate, while the Bottom Magnet 4 is also magnetized in a direction parallel to the surface of the bottom plate but with its magnetic pole facing that of the Bottom Magnet 3. Therefore, the magnetization direction of the Center Magnet 2 is substantially perpendicular to that of the Bottom Magnets 3 and 4. Depending on the magnetization direction of the Center Magnet 2, there are two possible magnetization directions for the Bottom Magnets 3 and 4. If the center magnet is magnetized in +Z direction, then the Bottom Magnet 3 will be magnetized in +X direction and the Bottom Magnet 4 will be magnetized in −X direction. Alternatively, if the Center Magnet is magnetized in −Z direction, then the Bottom Magnet 3 will be magnetized in −X direction and the Bottom Magnet 4 will be magnetized in +X direction.

Next to the Bottom Magnets 3 and 4 are two Bottom Poles 5 and 6 made from magnetically permeable materials, respectively. The two Bottom Poles 5 and 6 are set in rows parallel to the long direction of the cathode. There are two Side Magnets 7 and 8 set on the Bottom Poles 5 and 6, respectively. The two Side Magnets 7 and 8 are magnetized in a direction perpendicular to the surface of the Bottom Plate 1, but the direction is 180 degree different from that of the Center Magnet.

A Cooling Plate 9 made from non-magnetically permeable material is set above the Center Magnet 1 and Side Magnets 7 and 8. Water channel for cooling is usually integrated in or welded to the cooling plate.

A Center Pole 10 made from magnetically permeable material is set on the Cooling Plate 9, right above the Center Magnet 2. The Center Pole 10 features a part higher than the target surface with either a slop surface on each side as shown in FIG. 1 or a flat surface (not shown). There are two Side Poles 11 and 12 made from magnetically permeable materials. They are set on the Cooling Plate 9, one on each side and above the Side Magnets 7 and 8, respectively. The Side Poles 11 and 12 have a part higher than the target surface with either a slop surface as shown in FIG. 1 or a flat surface (not shown). The Center Pole 10 and Side Poles 11 and 12 are set in three rows parallel to the long direction of the cathode.

Target 13 is set on the Cooling Plate 9. Target 13 is set between the Center Pole 10 and Side Poles 11 and 12. Target 13 may comprise one or many parts.

Cathode Structure in End Portion

FIG. 2 shows the cross section of the end portion of the rectangular magnetron cathode in present invention. The Bottom Plate 14 is made from magnetically permeable material. It may be an extension of the Bottom Plate 1 in the straight portion described before or it may be a separate part with its surfaces parallel to those of the Bottom Plate 1.

An Inner Magnet 15 with a shape of half cylinder is set on the Bottom Plate 14 at its inner center. The Inner Magnet 15 is magnetized in a direction perpendicular to the surface of the Bottom Plate 14. The magnetization direction is the same as that of the Center Magnet 2 in the straight portion.

An Out Magnet 16 in semi-circular shape is set on the Bottom Plate 14 at its outer edge. The Out Magnet 16 is magnetized in a direction perpendicular to the surface of the Bottom Plate 14. The magnetization direction is 180 degree different from that of the Inner Magnet 15. The Out Magnet generally comprises many small parts. On the Out Magnet 16 is an Out Concentrator 17 made from magnetically permeable material.

An Cooling Plate 18 made from non-magnetically permeable material is set on the Inner Magnet 15 and Out Concentrator 17. The Cooling Plate 18 in the end portion and the Cooling Plate 9 in the straight portion described before are a single and complete plate. Water channel for cooling also exists in the Cooling Plate 18 and forms a continuous loop with the channel in the straight portion.

In the Cooling Plate 18 there is an End Shunt 19 made from magnetically permeable material. The End Shunt 19 may be also set on or below the Cooling Plate. Above the Cooling Plate 18 are an End Target 20 and an End Pole 21. The End Target 20 may be an integrated part of the Target 13 in the straight portion or it may be a different part comprising one or more pieces. The End Pole 21 that is made from magnetically permeable material features a part higher than the target surface with either a slop surface as shown in FIG. 2 or with a flat surface. The End Pole 21 may be an individual part or an integrated part of the Center Pole 10 in the straight potion.

Characteristics of the Magnetron Cathode in Present Invention

FIG. 3 and FIG. 4 show computer-simulated magnetic flux density in the plane of the target surface, including an end portion and part of the straight portion, in present invention. FIG. 3 is a contour plot of vertical component $B_n$ of the magnetic flux density. FIG. 4 is a contour plot of horizontal component $B_t$ of the magnetic flux density. As an example, FIG. 5 shows vertical flux density $B_n$ and horizontal flux density $B_t$ along one single line parallel to X-axis direction at Y=50 mm (refer coordinates in FIG. 3 and FIG. 4) in the target surface plane. It can be seen that the vertical component $B_n$ is close to zero over most of the target surface and it has at least 8 extrema with negative value and positive value one after another. The horizontal component $B_t$ has 3 extrema over the surface of the target. The minimum value of $B_t$ in the target center region is higher than 500 Gs, which is strong enough to confine efficiently the high-energy electrons. Generally the magnetic flux density has similar features along a closed racetrack over the target surface.

The movement of a charged particle in magnetic and electric fields is governed by Eqs. (1) and (2). During magnetron discharge high-energy electrons collide with sputtering gas atoms, i.e. Ar, and create $Ar^+$ ions. Different from electrons, $Ar^+$ ions are heavy and move directly along the electric field and strike the target, causing sputtering of the target material. Therefore, the target erosion is actually determined by both the magnetic field and the electric field. To maximize the target utilization, the magnetic and electric fields should be optimized in a combined manner by considering both the electron trajectories and ionization distribution. A $4^{th}$ order Runge-Kutta numerical method is developed to solve the electron movement Eqs. (1) and (2). FIG. 6 shows computer-simulated electron trajectories over part of the target surface in the straight portion. The trajectories exhibit two important features.

1. Electrons drift along complicated 3D trajectories over the target surface. Electrons starting at different positions have different tracks. There are several axis lines, around which electrons drift. This is quite different from a conventional magnetron cathode, in which there is only one axis line and all electrons drift around this line.
2. Electrons starting in the surface of the center pole 2 and side poles 3 and 4 cannot be confined near the target surface or in the dark space. Electrons starting in the target surface or in the dark space cannot drift to above the center pole 2 and side poles 3 and 4 without Ar scattering. This is due to the combined action of the magnetic and electric fields. It should be emphasized that the center pole 2 and side poles 3 and 4 have a cap over the target surface plane and consequently provide an electric field component parallel to the target surface. This field component repels electrons from the poles. Therefore, high-energy electrons exist only for a very short time over the center pole 2 and side poles 3 and 4. There will be consequently very few ionization events above these pole regions.

To optimize the magnetic and electric fields, ionization distribution and target erosion profile need to be simulated. Since electron/Ar collision is a random event, it is best suited for a Monte Carlo simulation. A computer program is developed to simulate electron/Ar collision. The collision probability is characterized by the total cross section of electron/Ar interaction [12], while the scattering direction of a post collision is described by a parameter called differen tial cross section [13]. FIG. 7 shows the simulated ionization distribution over part of the target surface in the straight portion. It should be noted that in the simulation of electron trajectory and ionization distribution, the electric field is eventually determined by the charged-particle distribution, which in turn is affected by the electric field. So, many times of iteration are conducted to achieve a steady status. Details on the simulation are out of the range of present invention and are, therefore, not described here. FIG. 7 indicates that most ionization events occur near the target surface. Very few ionization events can be seen over the center pole 2 and side poles 3 and 4 due to Ar and/or $Ar^+$ scattering.

Using the ionization distribution data, the target erosion profile can be simulated by considering the sputtering yield, which indicates the energy dependence of target atoms sputtered by each $Ar^+$ ion. The simulated target erosion profile in turn is used to guide modification to the magnet assembly and the shape of the magnetically permeable poles (electrodes). FIG. 8 shows an example of target erosion profile in the straight portion with optimized magnet assembly and electrode configuration. In this specific case, the target thickness is 12 mm and the target utilization is ~63%. Based on the theoretical simulation, a magnetron cathode is developed and tested. Experimental erosion profile of target is also plotted in FIG. 8. It is in good agreement with simulated result. It should be noted that the target utilization varies once the initial target thickness is different. For example, for a target of 10 to 15 mm thick, the final utilization ranges from 55% to 65%.

The plasma discharge of the magnetron in present invention can be maintained at low pressure with relatively low voltage. FIG. 9 shows the I-V curves of the present magnetron operated in Ar gas under different pressures. It can be seen that even at 1 mTorr pressure, the plasma sustains at a voltage as low as 266 V, indicating an excellent confinement of high-energy electrons. Increasing Ar pressure further reduces the critical voltage to maintain the plasma discharge and increases the discharge current. For instance, at 3 mTorr Ar pressure, the voltage is only ~357 V with an input DC power of 3.5 kW, giving a sputtering current as high as 9.85 A.

A rectangular magnetron cathode is usually used for large area coatings. A critical parameter is the film uniformity. FIG. 10 shows Cu film thickness distribution over the present rectangular magnetron cathode with a target length of 900 mm. The glass substrate is set at 90 mm away from the target surface. The gas pressure is 3 mTorr and sputtering voltage is 346 V with 3 kW DC power. A ±5% film uniformity is obtained over a length of ~790 mm.

In the simulated ionization distribution, very few ionization events do appear over the Center Pole 2 and Side Poles 3 and 4 (see FIG. 7). To verify whether the poles may be sputtered, a copper target is used and the deposited film is analyzed using X-ray fluorescence (XRF) spectrum. The "film" is deposited onto a soda-lima glass for a long period of two hours to ensure enough intensity for trace elements possibly incorporated in the film. FIG. 11 shows that there is no iron Kα line visible at around 6.38 keV. Considering the high sensitivity of XRF detection, it is clear that the steel center pole and side poles are not sputtered. As a matter of fact, a Cu layer can be seen on the surface of these poles after the sputtering process. This indicates that the poles are coated by the target material during sputtering, while the ionization over the poles produces much slower or even negligible sputtering.

CROSS-REFERENCE TO RELATED APPLICATIONS

[1]. P. S. McLeod, *Planar magnetron sputtering method and apparatus*, U.S. Pat. No. 3,956,093, May 11, 1976.
[2]. Charles B. Garrett, *Planar magnetron sputtering device*, U.S. Pat. No. 4,444,643, Apr. 24, 1984.
[3]. W. H. Class, G. J. Unterkofler, S. D. Hurwitt, *Magnetron sputtering target and cathode assembly*, U.S. Pat. No. 4,198,283, Apr. 15, 1980.
[4]. Jr. Morrison, F. Charles, *Planar magnetron sputtering device*, U.S. Pat. No. 4,162,954, Jul. 31, 1979.
[5]. Jr. Morrison, F. Charles, *Planar magnetron sputtering device*, U.S. Pat. No. 4,180,450, Dec. 25, 1979.
[6]. R. P. Welty, *Magnetron sputtering cathode*, U.S. Pat. No. 4,892,633, Jan. 9, 1990.
[7]. B. W. Manley, *Planar magnetron sputtering magnet assembly*, U.S. Pat. No. 5,262,028, Nov. 16, 1993.

OTHER REFERENCES

[8]. T. E. Sheridan, M. J. Goeckner, and J. Goree, *J. Vac. Sci. Technol.* A8, 30 (1990).
[9]. S. Ido and K. Nakamura, Jpn. *J. Appl. Phys.* 32, 5698 (1993).
[10]. S. Kondo and K. Nanbu, *J. Phys. D: Appl. Phys.* 32, 1142 (1999).
[11]. E. Shidoji, H. Ohtake, N. Nakano, and T. Makabe, Jpn. *J. Appl. Phys.* Pt.1, 38, 2131 (1999).
[12]. F. J. de Heer, R. H. J. Jansen, and W. van der Kaay, *J. Phys.* B12, 979 (1979).
[13]. S. N. Nahar and J. M. Wadehra, *Phys. Rev.* A35, 2051 (1987).

We claim:

1. A rectangular magnetron sputtering cathode for coating a substrate by means of sputtering in a vacuum chamber; said cathode including a Cooling Plate that separates the cathode into an upper part and a lower part; said Cooling Plate having a front surface, a body, and a back surface; said upper part comprising a Center Pole, two Side Poles, two End Poles, and Target; said Center Pole, Side Poles, and End Poles being made from magnetically permeable materials; said Target having a front surface, a body, and a back surface; said Target comprising two linear sections and two end sections; said lower part including a Bottom Plate, two Bottom Poles, two End Shunts, a Center Magnet, two Bottom Magnets, two Side Magnets, two Inner Magnets, two Out Magnets and two Out Concentrators; said Bottom Plate, Bottom Poles, Out Concentrators, and End Shunts being made from magnetically permeable materials; said Center Magnet, Inner Magnets, and Out Magnets being positioned on said Bottom Plate and having a north-south magnetic orientation perpendicular to the surface of said Bottom Plate; said Bottom Magnets being positioned between said Bottom Plate and said Bottom Poles and having a north-south magnetic orientation that is parallel to the surface plane of said Bottom Plate and is substantially perpendicular to the magnetic orientation of said Center Magnet; said Side Magnets being positioned on said Bottom Poles and having a north-south magnetic orientation perpendicular to the surface of said bottom plate; said Center Magnet, Bottom Magnets, Side Magnets, Inner Magnets, and Out Magnets generating a uniform and continuous magnetic field in a plane containing the surface of said Target with the aid of said Bottom Plate, Bottom Poles, Side Poles, Center Pole, Out Concentrators, and End Shunts.

2. A magnetron sputtering cathode as in claim 1; said Target comprising one or more parts; said target linear sections being positioned between said Center Pole and said Side Poles; said Target being set on said Cooling Plate with or without a spacer made from non-magnetically permeable material.

3. A magnetron sputtering cathode as in claim 1; said Center Pole, Side Poles, and End Poles being positioned directly on said Cooling Plate; part of said Center Pole, said Side Poles, and said End Poles being above said front surface of said Target; said End Poles being either individual parts or integrated parts of said Center Pole; said Center Pole and said Side Poles being aligned in three rows along the length of said Target; said Center Pole and said Side Poles having the same electric potential as said Target; said Center Pole being positioned at the center of said Cooling Plate; said Center Poles and said Side Poles comprising one or more parts, respectively.

4. A magnetron sputtering cathode as in claim 1; said Bottom Plate comprising one or more parts.

5. A magnetron sputtering cathode as in claim 1; said Center Magnet being positioned under said Cooling Plate; said Center Magnet being aligned in a row along the length direction of said Target; said Center Magnet being positioned under and parallel to said Center Pole; said Center Magnet having a front surface which is adjacent to said back surface of said Cooling Plate, a body, and a back surface which is in contact with said Bottom Plate; said Center Magnet comprising one or more parts.

6. A magnetron sputtering cathode as in claim 1; said Side Magnets being positioned under said Cooling Plate; said Side Magnets being aligned in two rows along the length direction of said Target; said Side Magnets being positioned under and parallel to said Side Poles; said Side Magnets having a front surface which is adjacent to said back surface of said Cooling Plate, a body, and a back surface which is in contact with said Bottom Pole; said Side Magnets comprising one or more parts; the magnetic orientation of said Side Magnets being 180 degree different from that of said Center Magnet.

7. A magnetron sputtering cathode as in claim 1, said Bottom Magnets being aligned in two rows parallel to the length direction of said Target; the magnetic polarity of said Bottom Magnets in one row facing that in another; said Bottom Magnets having a left surface, a right surface, and a body with the left and right surfaces in contact with said Bottom Plate and said Bottom Poles, respectively; said Bottom Magnets comprising one or more parts.

8. A magnetron sputtering cathode as in claim 1; the magnetic orientation of said Ilner Magnets being the same as that of said Center Magnet; the magnetic orientation of said Out Magnets being 180 degree different from that of said Inner Magnets; said Inner Magnets and Out Magnets comprising one or more parts, respectively.

9. A magnetron sputtering cathode as in claim 1; said End Shunts being positioned either in or out of said Cooling Plate; said Out Concentrators being positioned on said Out Magnet and having a front surface which is adjacent to said back surface of said Cooling Plate, a body, and a back surface which is in contact with said Out Magnet.

10. A magnetron sputtering cathode as in claim 1, said magnetic field in a plane containing the surface of said Target being characterized by 8 or more extrema for the magnetic flux density component that is perpendicular to said target surface with positive and negative extremum one after another; said magnetic field in a plane containing the surface of said Target being characterized by 3 or more extrema for the magnetic flux density component that is parallel to said target surface; said magnetic field in a plane containing the surface of said Target being characterized by a similar magnetic flux density distribution along a race track in said target surface.

* * * * *